(12) United States Patent
Huang et al.

(10) Patent No.: US 8,772,793 B2
(45) Date of Patent: Jul. 8, 2014

(54) LIGHT EMITTING DIODES AND METHOD FOR MANUFACTURING THE SAME

(75) Inventors: Shih-Cheng Huang, Hsinchu (TW); Po-Min Tu, Hsinchu (TW); Ya-Wen Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/272,229

(22) Filed: Oct. 13, 2011

(65) Prior Publication Data
US 2012/0175628 A1 Jul. 12, 2012

(30) Foreign Application Priority Data
Jan. 10, 2011 (CN) .......................... 2011 1 0003533

(51) Int. Cl.
*H01L 27/15* (2006.01)
(52) U.S. Cl.
USPC .......... 257/81; 257/76; 257/99; 257/E33.056; 257/E33.058

(58) Field of Classification Search
USPC ................. 257/76, 81, 99, E33.056, E33.058
See application file for complete search history.

(56) References Cited

U.S. PATENT DOCUMENTS

| 2006/0197102 | A1* | 9/2006 | Ogihara et al. | 257/99 |
| 2011/0133229 | A1* | 6/2011 | Tsai et al. | 257/93 |

* cited by examiner

*Primary Examiner* — Julia Slutsker
(74) *Attorney, Agent, or Firm* — Novak Druce Connolly Bove + Quigg LLP

(57) ABSTRACT

An exemplary LED includes an electrode layer, an LED die, a transparent electrically conductive layer, and an electrically insulating layer. The electrode layer includes a first section and a second section electrically insulated from the first section. The LED die is arranged on and electrically connected to the second section of the electrode layer. The transparent electrically conductive layer is formed on the LED die and electrically connects the LED die to the first section of the electrode layer. The electrically insulating layer is located between the LED die and the transparent electrically conductive layer to insulate the transparent electrically conductive layer from the second section of the electrode layer.

10 Claims, 6 Drawing Sheets

LIGHT EMITTING DIODES AND METHOD FOR MANUFACTURING THE SAME

BACKGROUND

1. Technical Field

The present disclosure relates to solid state light emitting devices and, more particularly, to light emitting diodes (LEDs).

2. Description of Related Art

In recent years, LEDs have been widely used in illumination. Typically, an LED includes an LED die, an electrode layer, and two gold wires. The LED die includes a light emitting surface. Two spaced terminals are formed on the light emitting surface. The LED die electrically connects to the electrode layer through wire bonding, in which the two gold wires are respectively soldered to the terminals and the electrode layer by solder. However, part of the light emitting surface of the LED die is blocked by the solder and the gold wires, resulting in decreasing of illumination efficiency of the LED.

What is needed, therefore, is an LED which can overcome the described limitations.

DETAILED DESCRIPTION

Figure 1:
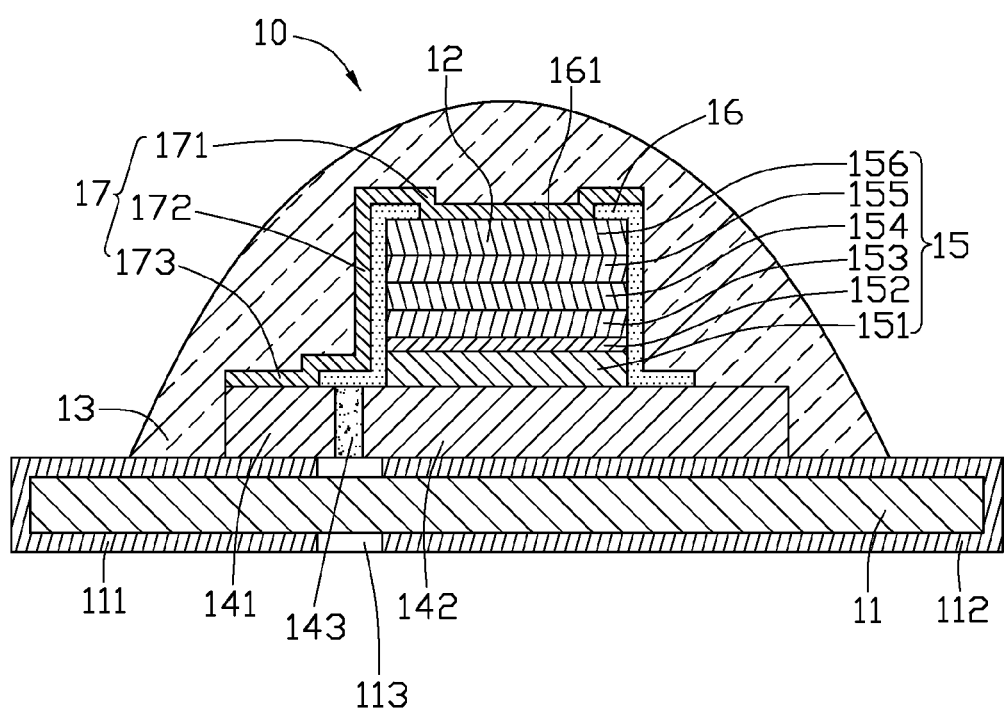
FIG. 1 is a cross-sectional view of an LED of a first embodiment of the present disclosure.

Referring to FIG. 1, an LED 10 is shown. The LED 10 includes a base 11, an LED chip 12 arranged on the base 11, and a packaging layer 13 arranged on the base 11 and encapsulating the LED chip 12 therein.

The base 11 is electrically insulating and has a size larger than the LED chip 12. An outer surface of the base 11 is coated with a layer of an electrically conductive material. A continuous gap 113 is defined in the electrically conductive material to divide the electrically conductive material into separate two parts, i.e., a first electrode part 111 and a second electrode part 112. The base 11 has good heat dissipation efficiency and absorbs heat generated from the LED chip 12 to prevent the LED chip 12 from overheating.

Figure 5:
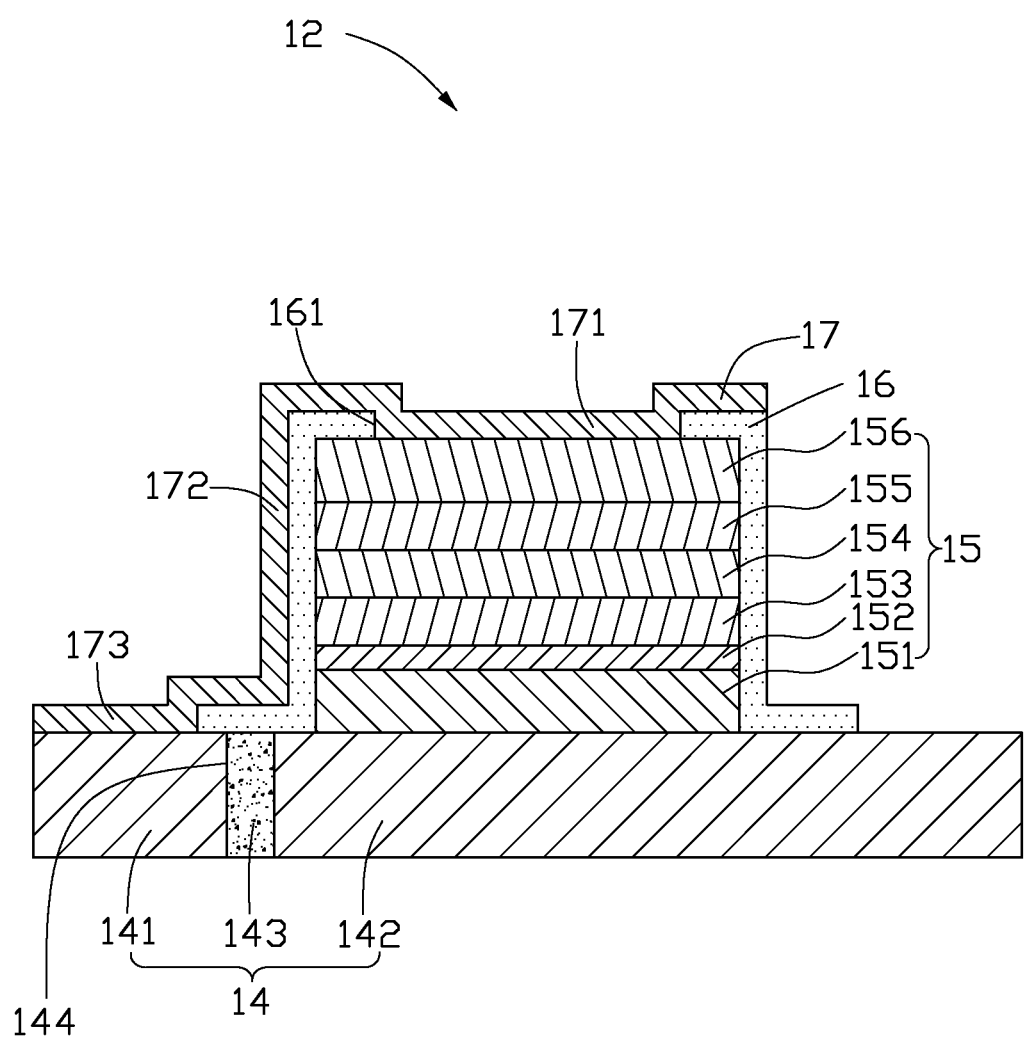

Referring also to FIG. 5, the LED chip 12 includes an electrode layer 14, an LED die 15 formed on the electrode layer 14, an electrically insulating layer 16 surrounding the LED die 15 and a transparent electrically conductive layer 17 electrically connecting the LED die 15 and the electrode layer 14.

The electrode layer 14 has a size smaller than that of the base 11 and is formed on a central portion of a top of the base 11. A through hole 144 is defined in the electrode layer 14 and aligned with the gap 113 of the base 11. In this embodiment, the through hole 144 is located at a left side of the LED die 15, and has a width smaller than a width of the gap 113 of the base 11. The through hole 144 is coaxial with the gap 113. An electrically insulating material 143 is filled in the through hole 144. The through hole 144 divides the electronic layer 14 into two separate sections, i.e., a first section 141 and a second section 142. The insulating material 143 is between the first section 141 and the second section 142 to insulate the first section 141 from the second section 142. The first section 141 and the second section 142 respectively electrically contact the first electrode part 111 and the second electrode part 112 of the base 11.

The LED die 15 includes an electrically conductive substrate 151, a reflecting layer 152 formed on the substrate 151, a P-doped region formed on the reflecting layer 152, an active layer 155 formed on the P-doped region, and an N-doped region formed on the active layer 155. In this embodiment, the P-doped region includes a P-type gallium nitrogen layer 153 and a P-type gallium nitrogen layer 154. The N-doped region is an N-type gallium nitrogen layer 156. The substrate 151, the reflecting layer 152, the P-type gallium nitrogen layers 153, 154, the active layer 155 and the N-type gallium nitrogen layer 156 are stacked one on the other along a vertical direction of the LED 10. Light emitted from the active layer 155 is reflected up by the reflecting layer 152, thereby enhancing light emitting efficiency of the LED 10. The substrate 151 is on the second section 142 of the electrode layer 14 and electrically connects with the second section 142.

The electrically insulating layer 16 is transparent and made of silicon dioxide or silicon nitride. In this embodiment, the electrically insulating layer 16 totally covers lateral sides of the LED die 15, and covers a periphery of a top side of the LED die 15 with a through hole 161 defined above a central portion of a top of the N-type gallium nitrogen layer 156. The electrically insulating layer 16 also covers part of top surfaces of the first and second sections 141, 142 near the LED die 15. The electrically insulating layer 16 covers the through hole 144 of the electrode layer 14.

The transparent electrically conductive layer 17 electrically connects the N-type gallium nitrogen layer 156 and the first section 141 of the electrode layer 14. The transparent electrically conductive layer 17 is made of transparent metal, indium tin oxide, or carbon nanotube film. The transparent electrically conductive layer 17 includes a first covering portion 171 on the top side of the LED die 15, a second covering portion 173 on the first section 141, and a connecting portion 172 interconnecting the first covering portion 171 and the second covering portion 173 and on a lateral side of a left part of the electrically insulating layer 16.

The first covering portion 171 fills the through hole 161 to connect the central portion of the N-type gallium nitrogen layer 156 of the LED die 15. The second covering portion 173 is arranged on the first section 141. The electrically insulating layer 16 is located between the electrically conductive layer 17 and the LED die 15 to electrically insulate the electrically conductive layer 17 from the LED die 15 except the central portion of the top of the N-type gallium nitrogen layer 156.

The packaging layer 13 is made of transparent, electrically insulating materials, such as silicone, epoxy, quartz, or glass. The packaging layer 13 encapsulates the LED chip 12 therein and is formed on the base 11.

In the present disclosure, because the transparent electrically conductive layer 17 and the electrically insulating layer 16 are transparent, and coated on the LED die 15 directly, light emitted from the active layer 155 is not blocked by any element of the LED 10. Therefore, light emitting efficiency of the LED 10 is improved in comparison with the conventional LED.

Referring to FIGS. 2-5, different steps of a method for manufacturing the LED chip 12 are shown.

Figure 2:
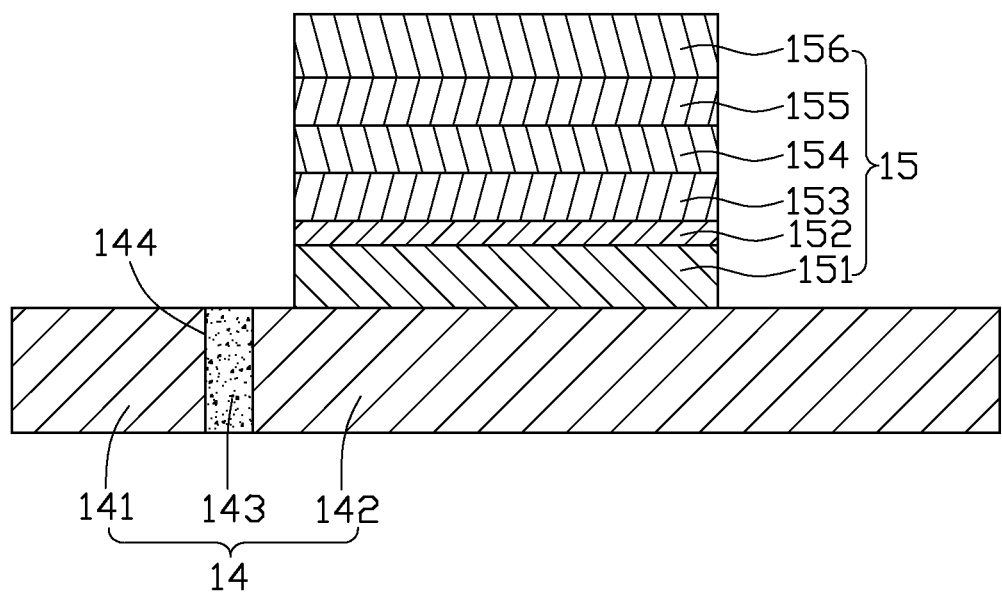
FIGS. 2-5 are cross-sectional views showing different steps of a method for manufacturing an LED chip of the LED of FIG. 1.

Referring to FIG. 2, the LED die 15 and the electrode layer 14 are provided. The electrode layer 14 is etched to define the through hole 144 therein. The electrically insulating material 143 is filled in the through hole 144. The substrate 151 of the LED die 15 is arranged on the second section 142 of the electrode layer 14.

Figure 3:
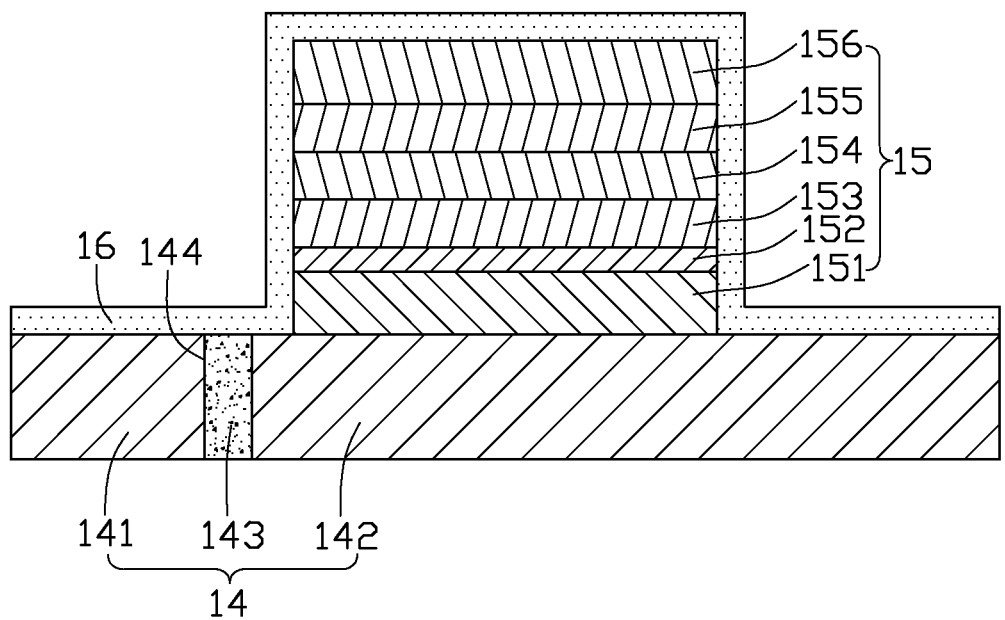
Figure 4:
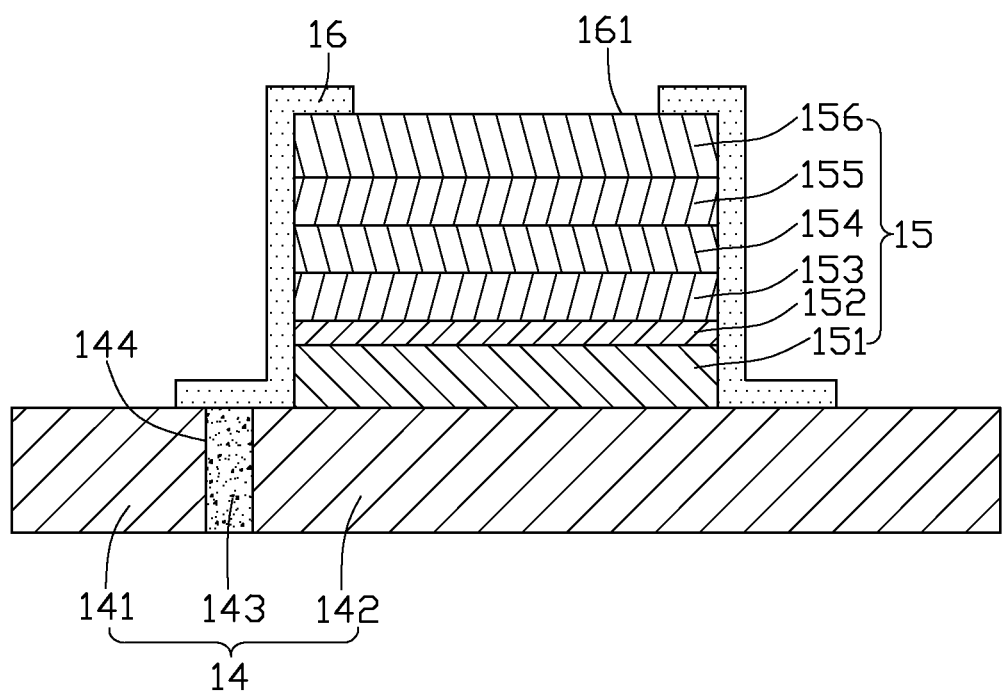

Referring to FIGS. 3-4, the electrically insulating layer 16 is coated on the periphery of the LED die 15 and the top side of the electrode layer 14 through electroplating or sputtering deposition. The electrically insulating layer 16 is etched to expose the central portion of the top of the N-type gallium nitrogen layer 156 and parts of the first section 141 and the second section 142 of the electrode layer 14. It should be understood that the electrically insulating layer 16 can be etched to just expose the central portion of the N-type gallium nitrogen layer 156 and a part of the first section 141, while the second section 142 of the electrode layer 14 can be remained to be covered by the electrically insulating layer 16.

Referring to FIG. 5, the transparent electrically conductive layer 17 is coated on corresponding parts of the LED die 15, the electrically insulating layer 16, and the electrode layer 14 through electroplating, sputtering deposition, or electron-beam evaporative deposition. In this state, the LED chip 12 is manufactured completely.

Referring to FIG. 1 again, the base 11 is provided. The base 11 is coated by the electrically material and the electrically material is etched to define the gap 113 at a left side of the base 11. The electrode layer 14 is arranged on the base 11 with the first section 141 and the second section 142 respectively electrically contacting the first electrode part 111 and the second electrode part 112 of the base 11, and the through hole 144 in alignment with the central portion of the gap 113. Finally, the packaging layer 13 is formed on the base 11 and encapsulates the LED chip 12 therein. In this state, the LED 10 is manufactured completely.

Figure 6:
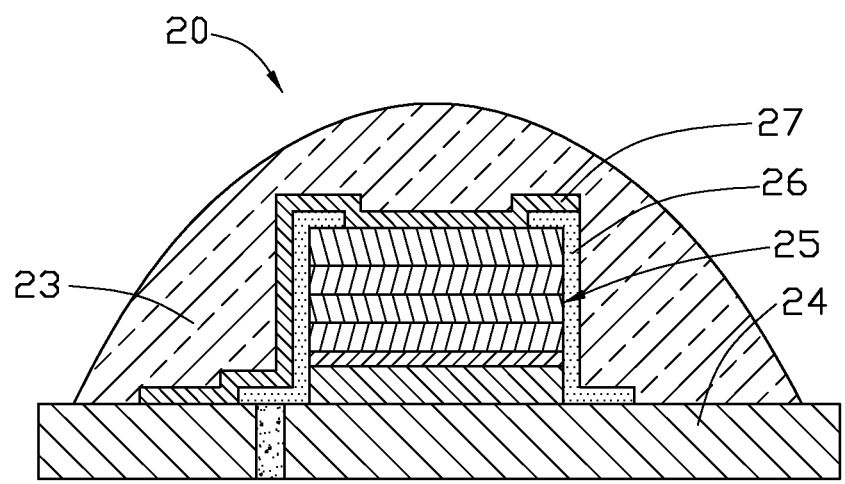
FIG. 6 is a cross-sectional view of an LED of a second embodiment of the present disclosure.

Referring to FIG. 6, an LED 20 of the second embodiment is shown. The LED 20 includes an electrode layer 24, an LED die 25, an electrically insulating layer 26, a transparent electrically conductive layer 27 and a packaging layer 23. The LED 20 is similar to the LED chip 12 of the LED 10 of the first embodiment. A difference between the LED 20 and the LED 10 of the first embodiment is that the base 11 and the first and second electrode parts 111, 112 of the first embodiment are omitted from the second embodiment. A width of the electrode layer 24 is larger than that of the electrode layer 14 whereby the packaging layer 23 covers a central portion of a top of the electrode layer 24, with a peripheral portion thereof being exposed. In the second embodiment, the first section of the electrode layer 24 functions directly as a first electrode part and the second section of the electrode layer 24 functions directly as a second electrode part. Like the first embodiment, in the second embodiment, the LED die 25, the electrically insulating layer 26 and the transparent electrically conductive layer 27 are also encapsulated by the packaging layer 23.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) comprising:
    an electrode layer comprising a first section and a second section electrically insulated from the first section;
    an LED die arranged on and electrically connected to the second section of the electrode layer;
    a transparent electrically conductive layer formed on the LED die, the transparent electrically conductive layer electrically connecting the LED die to the first section of the electrode layer;
    an electrically insulating layer located between the LED die and the transparent electrically conductive layer to insulate the transparent electrically conductive layer from the second section of the electrode layer; and
    an electrically insulating base located below the electrode layer, the electrically insulating base comprising a first electrode part and a second electrode part attached thereon, the electrode layer being arranged on the base and the first and second sections of the electrode layer respectively electrically contacting the first and second electrode parts;
    wherein bottom surfaces of the first section and the second section are coplanar, top surfaces of the first electrode part and the second electrode part are coplanar and respectively contact the bottom surfaces of the first section and the second section;
    wherein a through hole is defined in the electrode layer, an electrically insulating material is filled in the through hole to divide the electrode layer into the first and second sections, the through hole is below the LED die and entirely surrounded by the first and second sections, a gap is defined between the first electrode part and the second electrode to make the first electrode and the second electrode electrically insulate from each other, the through hole is coaxial with the gap, and the through hole has a width smaller than a width of the gap of the base.

2. The LED of claim 1, wherein the electrically insulating layer totally covers lateral sides of the LED die, and covers a periphery of a top side of the LED die with a through hole defined above of the LED die, the transparent electrically conductive layer fills the through hole of the electrically insulating layer to electrically connect with the LED die, and the LED die is arranged on the second section of the electrode layer.

3. The LED of claim 2, wherein the electrically insulating layer covers a part of the first section of the electrode layer to make the other part of the first section be exposed and electrically connect with the transparent electrically conductive layer.

4. The LED of claim 2, wherein the transparent electrically conductive layer comprises a first covering portion, a second covering portion, and a connecting portion interconnecting the first covering portion and the second covering portion, the first covering portion fills in the through hole and electrically connects with the LED die, and the second covering portion contacts the exposed portion of the first section of the electrode layer.

5. The LED of claim 1, wherein a packaging layer is formed on the electrode layer and encapsulates the LED die, the electrically insulating layer, and the transparent electrically conductive layer therein.

6. The LED of claim 1, wherein the electrically insulating layer is transparent.

7. The LED of claim 1, wherein the LED die comprising a substrate, a P-doped region, an active layer, and an N-doped region, the substrate, the P-doped region, the active layer, and the N-doped region being stacked one on the other along a vertical direction of the LED, and the substrate is arranged on the second section of the electrode layer.

8. The LED of claim 7, wherein a reflecting layer is located between the P-doped region and the substrate of the LED die.

9. The LED of claim 7, wherein the P-doped region comprises two stacked P-type gallium nitrogen layers.

10. The LED of claim 7, wherein the N-doped region is an N-type gallium nitrogen layer.

* * * * *